United States Patent [19]

Ohmi et al.

[11] Patent Number: 4,869,301

[45] Date of Patent: Sep. 26, 1989

[54] CYLINDER CABINET PIPING SYSTEM

[75] Inventors: Tadahiro Ohmi; Kazuhiko Sugiyama; Fumio Nakahara, all of Sendai; Masaru Umeda, Tokyo, all of Japan

[73] Assignee: Tadahiro OHMI, Miyagi-ken, Japan

[21] Appl. No.: 194,841

[22] Filed: May 17, 1988

[30] Foreign Application Priority Data

Mar. 5, 1988 [JP] Japan .................................. 63-052457

[51] Int. Cl.⁴ ................................................ B08B 9/00
[52] U.S. Cl. ........................................ 141/85; 141/98; 137/240; 134/169 R; 437/949
[58] Field of Search ........................ 141/98, 4, 5, 8, 11, 141/85, 89; 137/240, 238; 437/949; 134/169 R, 169 A, 169 C, 166 C

[56] References Cited

U.S. PATENT DOCUMENTS

| | | | |
|---|---|---|---|
| 3,186,214 | 6/1965 | Roberts | 137/240 |
| 3,894,421 | 7/1975 | Sperberg | 141/4 |
| 4,063,588 | 12/1977 | Thorogood | 137/240 |
| 4,100,310 | 7/1978 | Ura et al. | 437/949 X |
| 4,157,248 | 6/1979 | Queiser | 137/266 |
| 4,383,547 | 5/1983 | Lorenz et al. | 134/166 C |
| 4,534,943 | 8/1985 | Novak et al. | 137/312 |
| 4,554,942 | 11/1985 | Williams et al. | 134/166 C |
| 4,768,543 | 9/1988 | Wienke et al. | 137/240 |

FOREIGN PATENT DOCUMENTS 0103311   6/1982   Japan .................................. 437/949

Primary Examiner—Ernest G. Cusick
Attorney, Agent, or Firm—Albert L. Jeffers; Anthony Niewyk

[57] ABSTRACT

The cylinder cabinet piping system of this invention has a system to supply a purge gas continuously to the main line, or to the main line and the branch line, thereby to prevent stagnation of gas in the purge gas line and to supply a super-high-purity gas to a process unit.

12 Claims, 12 Drawing Sheets

CYLINDER CABINET PIPING SYSTEM

BACKGROUND OF THE INVENTION

This invention relates to a cylinder cabinet piping system for a gas cylinder which supplies a feed as to a thin-film making or fine pattern etching process, more particularly to a cylinder cabinet piping system which makes it possible to form high-quality thin films and to conduct high quality, fine pattern etching.

Recently, a process for forming high-quality thin films or high quality, fine pattern etching requires a technique that supplies a superhighly pure gas to such a process to keep the process environment highly pure.

Taking a semiconductor device as an example, the unit elements become more and more small in size to enhance the degree of integration of an integrated circuit, and extensive research and development programs are being carried out to commercialize a semiconductor device of micron or submicron order, or even of 0.5 μm or less. Such devices are produced by repeating a thin-film making process and a process for etching these thin films into given circuit patterns, where a silicon water is normally placed in a reaction chamber filled with a given gas. The reaction chamber is kept under vacuum to obtain a longer mean free path of the gas molecules for etching and filling through holes and contact holes of a high aspect ratio, and also to control the vapor-phase reactions. Impurities present in these processes cause several problems, such as degradation of the thin films, lowered accuracy of the fine structures, and the insufficient adhesion between the thin films. It is essential to have the reaction environments for film making and etching fully controlled, in order to produce integrated circuits of submicron or lower submicron patterns, densely on a large-size wafer at a high yield. This requires a technique that can supply a superhighly pure gas to the process.

The gases for semiconductor production may broadly fall into two general categories; one includes relatively stable, common gases such as $N_2$, Ar, He, $O_2$, and $H_2$, and the other are special gases which are either strongly toxic, spontaneously combustible or corrosive, such as $AsH_3$, $PH_3$, $SiH_4$, $Si_2H_6$, HCl, $NH_3$, $Cl_2$, $CF_4$, $SF_6$, $NF_3$ and $WF_6$. Those gases falling into the first category are mostly sent directly from the purification unit to the semiconductor production unit, since they can be handled relatively easily. The storage, purification and piping systems have been sufficiently developed to directly supply these gases from the purification to the process unit, (Tadahiro Ohmi, "Challenges to ppt, gas piping system for semiconductor production, which challenges to ppt impurities", Nikkel Micro-devices, pp. 98–119, July 1987). Those gases falling into the second category, on the other hand, are mostly sent from cylinders to the process unit via a cylinder cabinet piping system, since they must be handled much more carefully and are used in smaller quantities.

The most critical problems associated with the gas supply from the cylinder to the process unit via cylinder cabinet piping system are coming from contamination of the gases caused by stains on the internal walls, leaks at the valve-cylinder connections and large quantities of gases adsorbed on the cylinder valve internal walls which permits no cleaning. These problems, however, have been mostly solved by the application of combined electro-polishing to the internal walls to make them into a mirror surfaces free of fabrication-related degradation, and the development of an external screw type cylinder valve in which an MCG (Metal C ring Fitting), incorporating a purge valve, is used.

(Tadahiro Ohmi and Junich Murota, "Clean Cylinders and Gas Filing Technology", 6th Super LSI Ultra-clean Technology Symposium Proceedings, and "High-Performance Process Technology III", pp. 109–128, January, 1988). These developments, however, are still incapable of coping with contamination of the purge gas with moisture released from the piping internal walls, since there are a number of gas stagnant sections in the purge gas system in the cylinder cabinet piping system. The gas supply line extending from the cylinder valve to the process unit will be contaminated with moisture when purged with the gas containing a large quantity of moisture. This contamination could eventually damage the process by lowering the purity of the feed gases to the process, even when they themselves are sufficiently clean in the cylinders.

For example, the newly developed DC-RF coupled bias sputtering device gives excellent, mirror-surfaced Al thin films which are completely free of hillocks, even when they are thermally treated at 400° C. (T. Ohmi, H. Kuwabara, T. Shibata and T. Kiyota, "RF-DC coupled mode bias sputtering for ULSI metalization". Proc. 1st. Int. Symp. on Ultra Large Scale Integration Science and Technology, May 10–15, 1987, Philadelphia, and T. Ohmi, "Complete Removal of Impurities, Grasp of Hillock-Free Al Film-Making Conditions", Nikkei Microdevices, pp. 109–111, October, 1987). In the production of Al thin films using the above device, the presence of 10 p.p.b. or more, moisture in the Ar sputtering atmosphere will degrade the surface morphologies of the Al thin films. It is therefore impossible, when the moisture is present beyond the above level, to optimize the film-making conditions for production of the hillock-free Al thin films whose surface resistivity is the same as that of the bulk Al body. It has been found that the Al film-making conditions can not be optimized unless the moisture level is lowered below 10 ppb.

It has been further found that vaccum CVD, which was before considered to be incapable of growing a Si thin film selectively and epitaxially under the commercial conditions (650° C. and several Torr.), allows the selective and epitaxial growth, provided that the moisture adsorbed on the wafer is sufficiently controlled by using superpure $SiH_4$, $H_2$, and $N_2$ gases containing moisture at 10 ppb or less. Thus, Si can be epitaxially grown on a clean Si surface, while growth of polysilicon on $SiO_2$ is efficiently controlled (Junichi Murota, Naoto Nakamura, Manabu Kato, Nobuo Mikoshiba and Tadahiro Ohmi, "Highly Selective, Ultraclean CVD Technology", 6th Super LSI Ultraclean Technology, III", January, 1988).

Figure 14:
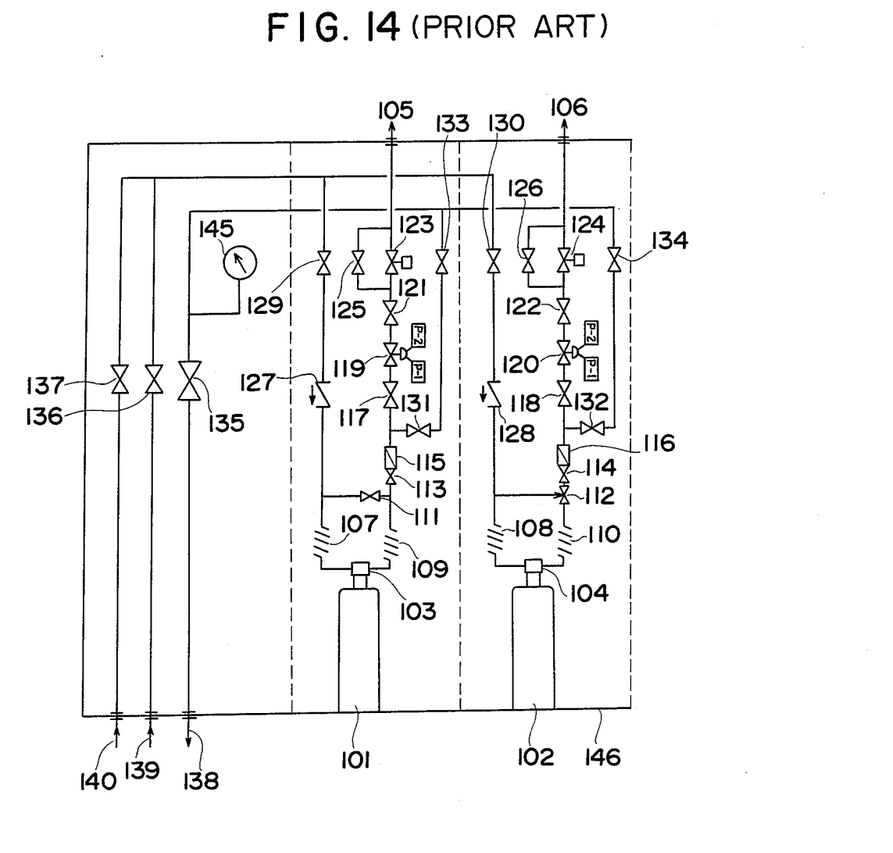
FIG. 14 shows the conventional cylinder cabinet piping system.

FIG. 14 presents a flow of one of the most well-arranged, conventional cylinder cabinet piping systems. A cylinder cabinet piping system has, in general, 3 to 6 gas cylinders, and 100 to 200 units are in service for semiconductor production lines in a semiconductor factory.

A cylinder cabinet piping system is described by referring to FIG. 14. This system has, for simplicity, two gas cylinders 101 and 102, each provided with a cylinder valve 103 or 104 consisting of a main valve and purge valve; 107 and 108. 109 and 110 are spiral pipes to provide a flexibility for the piping system for easily removing the cylinder from the system, which are normally ¼" size stainless pipes (SUS316L) electropolished for their internal walls; 111 and 112 are 3-port branching valves where only one port is opened or closed; 113, 114, 117, 118, 121, 122, 125, 126, 129, 130, 131, 132, 133, 134, 135, 136, 137 are stop valves; 115 and 116 are filters to remove foreign matter from the gases; 119 and 120 are pressure regulators; 123 and 124 are emergency shut-off valves for emergencies such as earthquakes; 127 and 128 are check valves which provide a flow only in the direction indicated by the arrow; 145 is a vacuum gauge; 138 is a large-size (½" or 1") vacuum exhaust line of stainless steel; 139 and 140 are purge lines to purge the cylinder cabinet piping system, where $N_2$ and Ar flow through 139 and 140, respectively; 105 and 106 are feed supply lines to pass the feed gases in the cylinder to the process unit. The purge and feed supply lines are of stainless steel (SUS316L), ¼" or ⅜" in size depending on the quantity of the gases flowing therethrough, the inner walls of which are electro-polished. 146 is a supporter for the cylinder cabinet piping system.

Next, the functions of each component and the operational procedures are described, by referring to FIG. 14, for one system line for simplicity. First, the procedures for replacing the cylinder are described. The cylinder cabinet piping system is contaminated more on this occasion than on any other by in-flowing external atmosphere. The gas cylinder 101 is removed out of the system, with the main and purge valves of the cylinder valve 103 open, the stop valves 113 and 137 closed, the branching valve open and the stop valve 129 and 136 open. The system is contaminated to a lesser extent while the cylinder is being removed, since $N_2$ gas from the $N_2$ purge gas line flows outward after passing through the spiral lines 107 and 109. Velocities of the $N_2$ as flowing out of the system are normally set at 3 to 10 m/s. The higher the velocity at which $N_2$ flows out, the less the extent of the system contamination. The new cylinder is mounted on the system, while $N_2$ gas is being blow. On completing the cylinder replacement, the $N_2$ gas remaining in the system is evacuated with the purge valve of the cylinder valve, the valve 129 and the valves 113, 131, 133 and 135 open, and the branching valve 111 and the valve 117 closed. The vacuum pump used is a turbomolecular pump free of oil contamination by the reverse diffusion. Vacuum exhaustion through small-size pipes is insufficient to completely drive off the $N_2$ contaminated with trace components of atmosphere in one time. Next, the system is filled with Ar to a given pressure level (for example, 2 to 5kg/cm$^2$), with the valve 137 open and the valve 133 closed, and then the Ar gas is again evacuated with the valve 137 closed and 133 open. The Ar filling/evacuating is repeated 5 to 10 times before the feed gas is supplied to the feed supply line. Then, the feed gas supply is started by closing the purge valve of the cylinder valve and the valves 129, 137 131 and 135, and opening the valve 121 and finally the main valve of the cylinder valve. Ar is used as the batch purge gas, because it is inert, to have no effect on the process even when it remains in the system in small quantities, easily purified, and relatively inexpensive.

As described above, the gas in the purge lines 139 and 140 remain stagnant while the feed gas is being supplied from the cylinder 101 to the supply line 105. This period is very long, since a semiconductor production line frequently operates continuously for 24 hrs. When the purge gas is left stagnant for a long time, its purity is invariably lowered by moisture or other gaseous impurities released from the pipe inner walls. The purge line system, having a number of branches, is more affected by these impurities. When 2 or 3 branches are in service, the purge gas flowing therethrough is so small in quantity that most parts of the system are left essentially intact. As a result, the purity of the purge gas is lowered.

The lower-purity purge gas remaining in the system hinders greatly the semiconductor production, since it contaminates the gas supply line during the next purging period. Taking moisture as an example, which poses critical problems in the semiconductor production, moisture in the purge gas supplied from a gas supply line in a cylinder cabinet piping system was measured 2 ppb when the purge gas was allowed to flow continuously through the entire system, but this level increased to 30 and 80 to 90 ppb when the purge gas was blown at 6l/min. and 1 l/min., respectively, while all the branches, after having being sealed for 1 month, were left stagnant. The system used in the above tests comprised a ⅜" size, about 30m long, stainless steel pipe (SUS316L) serving as a Ar purge gas line extending from an Ar purification unit to a cylinder cabinet piping system, and ⅜" size, stainless steel (SUS316L) branching pipes leading to other units having a total length of about 34 m and 6 branching points, where the inner walls of these purge gas line and branch lines were electropolished. As shown, water content in the purge gas increased, to a varying extent depending on the purge gas rate, due to the presence of stagnant sections in the system. This resulted from contamination of the purge gas with the stagnant gas to which gaseous impurities were released from the inner walls. Purity of the purge gas decreases in such a cylinder cabinet piping system as that shown in FIG. 14, due to stagnation of large quantities of gases in the purge gas line and the branches therefrom.

It is thus essential to develop a piping technique that can eliminate stagnant sections from the entire system including the branch systems, in order to supply a superhigh-purity cylinder gas to a semiconductor production unit. Before the present invention, no such piping technique has been developed that prevents stagnation of purge gas line in a cylinder cabinet piping system.

In addition, those techniques are also in demand that can effectively prevent contamination of each line with air or a gas from another line, in order to keep the feed gas superhighly pure.

The other problems involved in the conventional cylinder cabinet piping system are those associated with airtight or leak tests. Airtightness of the connections around a newly mounted cylinder is confirmed either by a bubble test or pressure drop test after sealing a high pressure gas in the space to be tested. Quantity of leak detectable by these tests, however, is limited to $10^{-3}$ to $10^{-6}$ Torr l/s. The piping fittings are so developed at present as to make it possible to decrease a leak quantity to $2 \times 10^{-11}$ Torr l/s or less, and the airtight test for such a system is carried out under a vacuum state using a He leak detector. It is thus to be desired that a cylinder cabinet piping system has connections around the cylinder so structured as to be suited for such airtight test, in order for it to supply a superhigh purity as to a process unit.

It is the object of the present invention to provide a cylinder cabinet piping system, which has no stagnant sections in the purge gas line, prevents contamination of each line with air or gas from another line as far as possible and has connections around the cylinder so structured as to be suited for a high-precision airtight test, in order to solve the above problems.

SUMMARY OF THE INVENTION

To above objects, according to one aspect of the present invention, there is provided a cylinder cabinet piping system comprising at least one cylinder gas supply line which supplies a gas in a cylinder to a process unit, at least one main line, at least one branch line which branches off said main line to said cylinder gas supply line via a valve, and a means to supply a purge gas continuously to said main line, or to said main line and said branch line.

The cylinder cabinet piping system of this invention has a means to supply a purge gas continuously to the main line, or to the main line and the branch line, thereby to prevent stagnation of gas in the purge gas line and to supply a super-high-purity gas to a process unit.

PREFERRED EMBODIMENT

Figure 1:
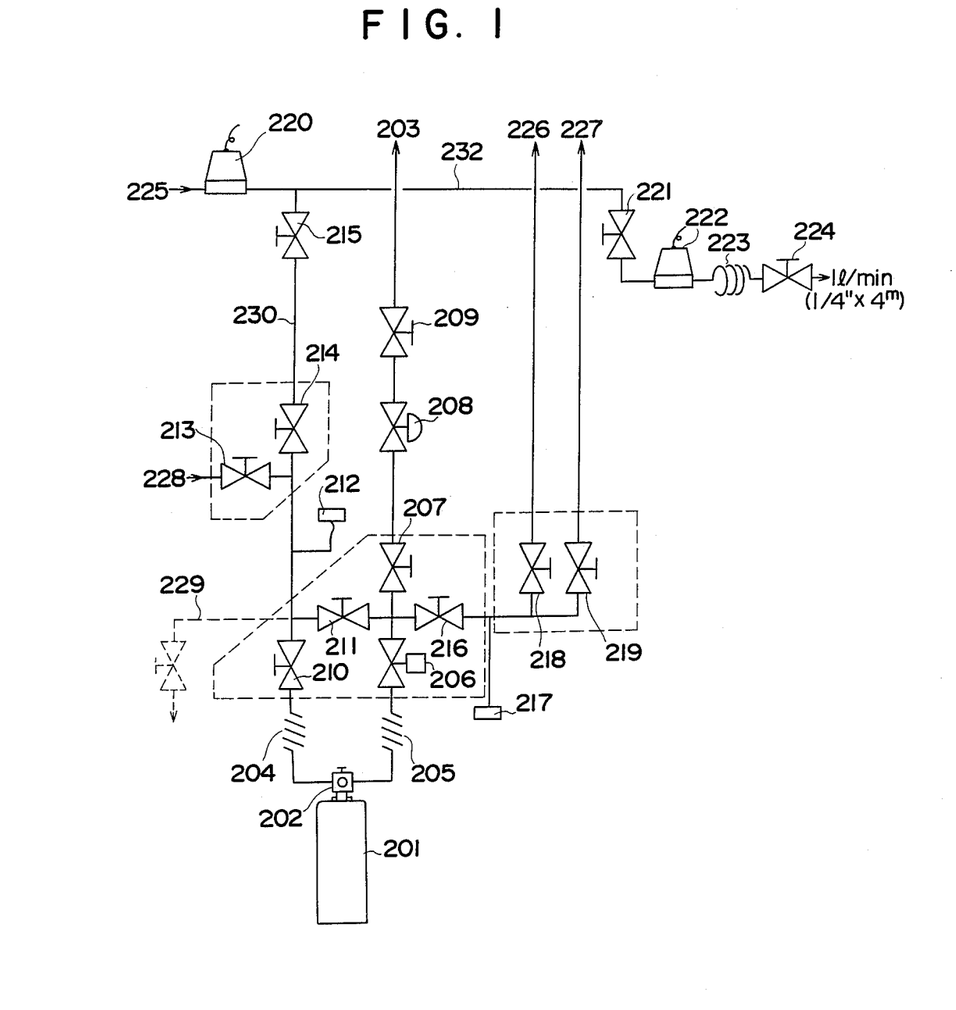
FIG. 1 shows one preferred embodiment of the cylinder cabinet piping system of the present invention.

FIG. 1 represents one preferred embodiment of the cylinder cabinet piping system of the present invention. The system shown in the figure has one gas cylinder for simplicity, where 201 is a gas cylinder; 202 is a cylinder valve consisting of a main and purge valve; 204 and 205 are spiral pipes to provide a flexibility for the piping system for removing the cylinder form the system easily, which are normally $\frac{1}{4}''$ size stainless pipes (SUS316L) electropolished for their internal walls; 207, 209, 210, 211, 213, 214, 215, 216, 218, 219, 221, and 224 are stop valves; 206 is emergency shut-off valve for emergencies such as earthquakes; The integrated unit of 206, 207, 210, 211 and 216 is a monoblock valve, so designed as to minimize the gas stagnant space; Each combination of 213/214 and 218/219 is an integrated 3-port valve unit; 208 is a pressure regulator; 212 and 217 are diaphram type pressure gages; 220 is a mass flow meter; and 222 is a mass flow controller (the system shown in FIG. 1 uses a mass flow controller capable of automatically controlling rapidly fluctuating flow of gas in the purge gas line, which may be replaced by a conventional rotameter provided with a needle valve, since it is positioned in an exhaust line where accurate flow controlling is not needed). These parts are preferably electropolished on their inner walls, in order to prevent particle formation and inflow of an external gas and to minimize release of the system gas.

Further more, 225 is a purge gas line that passes a gas through the system to purge it, which consists of a main line 232 and a branch line 230 (it is a spiral pipe to prevent contamination of the system with air reversely diffusing into the purge gas outlet, and is preferably $\frac{1}{4}''$ in size, about 4 m long and of stainless steel (SUS316L), whose inner walls are electropolished; 227 is an exhaust line through which the system is evacuated, which is a stainless steel pipe with fairly large size $\frac{1}{2}''$ or 1''; 226 is an exhaust line through which contaminants in the system are exhausted; 228 is a high-pressure gas line for the airtight test for the connections around the cylinder; 229 is a leak test port for the leak test of the connections around the cylinder under a vacuum state, using a He leak detector; 203 is a cylinder gas supply line is supply the feed gas to the process unit. The portion connected to the cylinder valve 202 from the valve 210 through spiral pipe 204 is the purge line. These purge gas lines, exhaust lines high-pressure gas line, leak test port, cylinder gas supply and purge line are sized at $\frac{1}{4}''$ or $\frac{3}{8}''$ depending on quantities of gas they handle, of stainless steel (SUS316L) and electropolished for their inner walls.

Next, the functions of these parts and the operational procedures therefor are described, referring to FIG. 1.

First, the system to continuously supply the purge gas is described, which prevents the lowering of the purge gas purity as a result of the contamination with the gases, caused by moisture, released from the purge gas line inner walls. The mass flow controller 222 is so operated to control the gas flow at 1 l/m or more, to prevent contamination of the system with air reversely diffusing into the outlet of the $\frac{1}{4}''$-size, 4 m long pipe 223, while the valves 221 and 224 kept open. This system prevents stagnation in the purge gas line and thereby to supply the high-purity purge gas by continuously blowing the purge gas to positively prevent air from flowing into the system. A small quantity of high-purity $N_2$ gas as the purge gas can keep contaminant levels in the purge gas below several ppb, when blown continuously.

The purge gas is continuously blown for only the main line in the system shown in FIG. 1, considering the cost and unit space. This design is insufficient to prevent stagnation in the branch line leading to each cylinder. Two countermeasure steps against stagnation in the branch line provides a system which purges each branch line continuously, and selecting a suitable material that can minimize release-related problems for the branch line, since it is sufficiently short.

Figure 2:
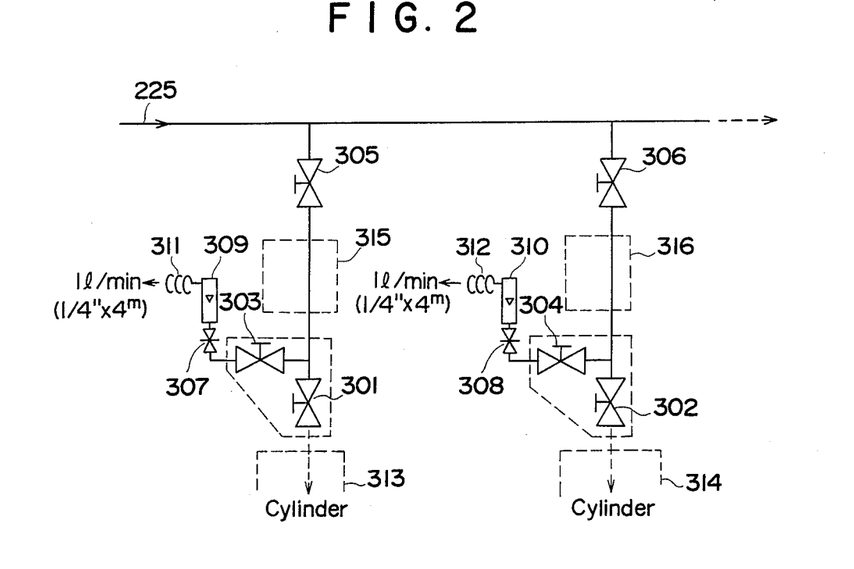
FIG. 2 shows the cylinder cabinet piping system of the present invention, having an idealized purge gas line.

FIG. 2 shows a system where the purge gas is passed continuously through each purge gas line. It has two branch lines coming from the purge gas line 225 for simplicity; 225 is a purge gas line which corresponds to the one shown in FIG. 1; 301, 302, 303, 304, 305 and 306 are stop valves, where the valves 305 and 306 correspond to the valve 215 in FIG. 1, and each combination of the valves 301/303 and 302/304 is an integrated, 3-port valve unit; 313, 314 each correspond to the monoblock valve integrated by the valves 206, 207, 210, 211 and 216 shown in FIG. 1; 315, 316 each correspond to the integrated 3-port valve composed of the valves 213 and 214 shown in FIG. 1; 307, 308 are flow control valves; 309, 310 are rotameters; 307/309 and 308/310 may be replaced by mass flowcontrollers, and stainless steel spiral pipes 311 and 312 correspond to 223 shown in FIG. 1. The cylinder cabinet piping system shown in FIG. 2 represents an ideal system almost completely free of gas stagnation in the purge gas line.

Another approach of using a material which minimizes release-related problems may be represented by the system shown in FIG. 1, where out-gas-free stainless steel oxidized with a super-high-purity oxygen gas is used for the branch line leading to the cylinder from the purge gas line, since stagnation occurs most frequently at the branching-off point (Kazuhiko Sugiyama, "Surface Treatment Techniques for Out-Gas-Free, Stainless Pipes", 6th Super LSI Ultra-clean Technology Symposium Proceedings, "High-Performance Process Technology III", January, 1988; Japanese Patent Application Number 62-268762; and Japanese Patent Application Number 63-5389). The oxidation-treated stainless steel releases moisture and other gaseous contaminants so quickly that the pipes thereof can be cleaned easily with a purge gas in several minutes even when the purge gas is left stagnant for a long time, with the result that purity of the purge gas flowing into the line 225 can be returned to a desired level in a very short time.

Each of these approaches, or combination thereof, can minimize the effects of gaseous contaminants released from the inner walls of the branch line of the purge line. Any one can be used for a specific system.

Figure 3:
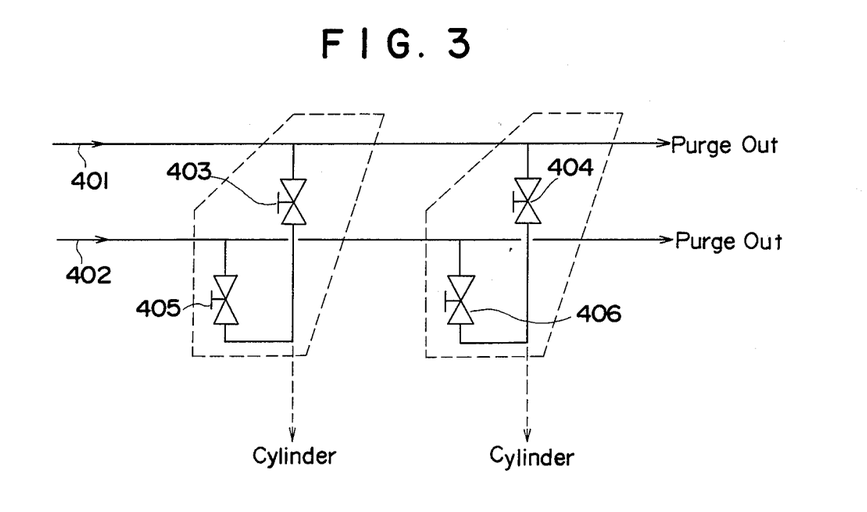
FIG. 3 shows the cylinder cabinet piping system of the present invention, where more than one gas type are used as the purge gases.

It is preferable to use Ar as the purge gas, since it affects the process unit little and is inexpensive. The purge gas, however, may be a mixture of two or more gases, such as the case shown in FIG. 14 where a mixture of $N_2$ and Ar is used. FIG. 3 shows a system which uses a mixture of two gas types as the purge gas, where 401 and 402 are purge gas lines, and 401 uses Ar gas, 402 uses $N_2$ for example. For other numerals in FIG. 3, 403, 404, 405 and 406 are stop valves, each combination of 403/405 and 404/406 being a monoblock valve unit where two valves are integrated. Each of the purge gas lines 401 and 402 is connected to the purge system like that shown in FIG. 1 to which the line 225 is connected.

When more than one purge gases are used, as in the system shown in FIG. 3, a monoblock valve which in almost completely free of stagnant parts must be used to branch off a line, and each purge gas line must be so designed as to be purged at its end.

FIG. 1 shows no filter such as 115 and 116 represented in FIG. 14. These are protective devices for the pressure regulators 119 and 120 for preventing foreign matter from being trapped by their seats to cause leaks. Development of clean cylinders and improved piping techniques, however, make the system almost particle-free. A filter itself has an inherent potential to release large quantities of gas, thus causing contamination of the system.

Figure 4:
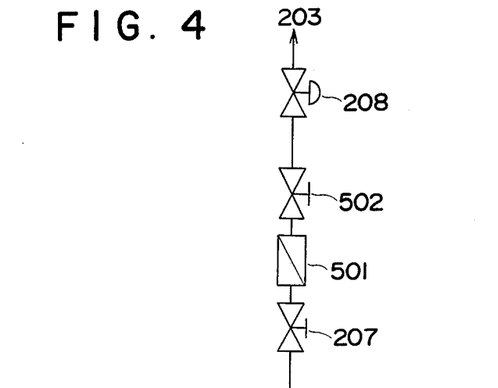
FIG. 4 shows the cylinder cabinet piping system of the present invention, where a pressure regulator in the cylinder gas supply line protected by a filter.

This cylinder cabinet piping system of the present invention, therefore, has no such filter. The system, however, is not completely free of particles, and it is necessary, when a filter is needed to protect the pressure regulator, to provide a piping system with the filter, as shown in FIG. 4, where 207 is a stop valve; 208 is a pressure regulator, 501 is a filter, 203 is a cylinder gas supply line. The figure depicts a position of the filter, and the parts 203, 207 and 208 correspond to those shown in FIG. 1.

The valve 502 is needed to prevent inflow of air into the system when the filter 501 or the pressure regulator 208 is repaired or replaced. Use of a conventional Teflon membrane filter, which is known for its high adsorptive capacity, is not desired for this system, since it may rapidly lower the purity of the system gas.

A ceramic filter, comprising elements of a ceramic material such as $Al_2O_3$ and SiC, is desired for the system of the present invention. Such a filter, being baked at around 200° C., reduces an impurity level associated with a Teflon membrane filter by three factors or more.

In succession, a system provided with a double protection mechanism is described, where inflow of air into the system and mix of a gas in one line into another line are minimized.

Referring to FIG. 1, the cylinder gas supply line 203 is doubly protected by the valve 211 and 214 or 215 in the purge gas line 225, by the valves 216 and 218 in the exhaust line 226, and by the valves 216 and 219 in the vacuum line 227. Let us consider protecting these lines from each other by the double valve systems. Assuming, for example, the valve 218 and 219 have leaky seats for one reason or another, the gas supply line can be blocked off from other lines by the valve 216. It is thus possible to minimize contamination of one line with a gas in another line by providing two valves which separate them from each other. It is generally impossible to completely block off a line by a single stop valve which is guaranteed for more than one million open/close cycles. Note that a quantity of leak through the closed seat of such a valve is of the order of $1 \times 10^{-9}$ Torr l/s.

Successively, the operational procedures are described.

Figure 5:
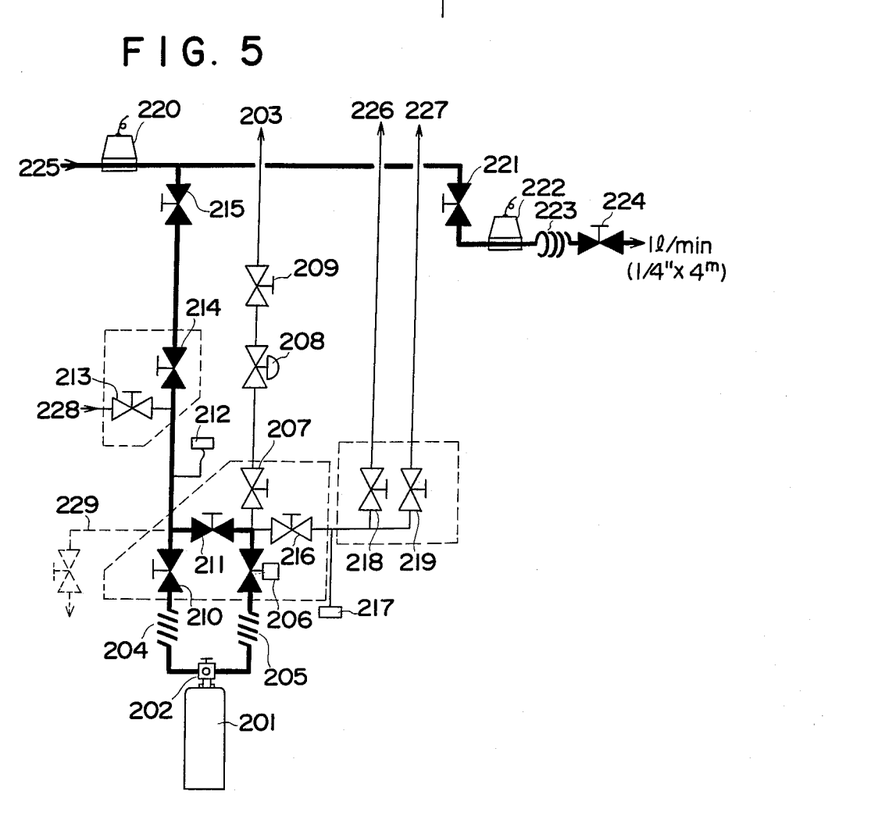
FIG. 5 through 13 illustrate the operational procedures for the cylinder cabinet piping system of the present invention.
Figure 6:
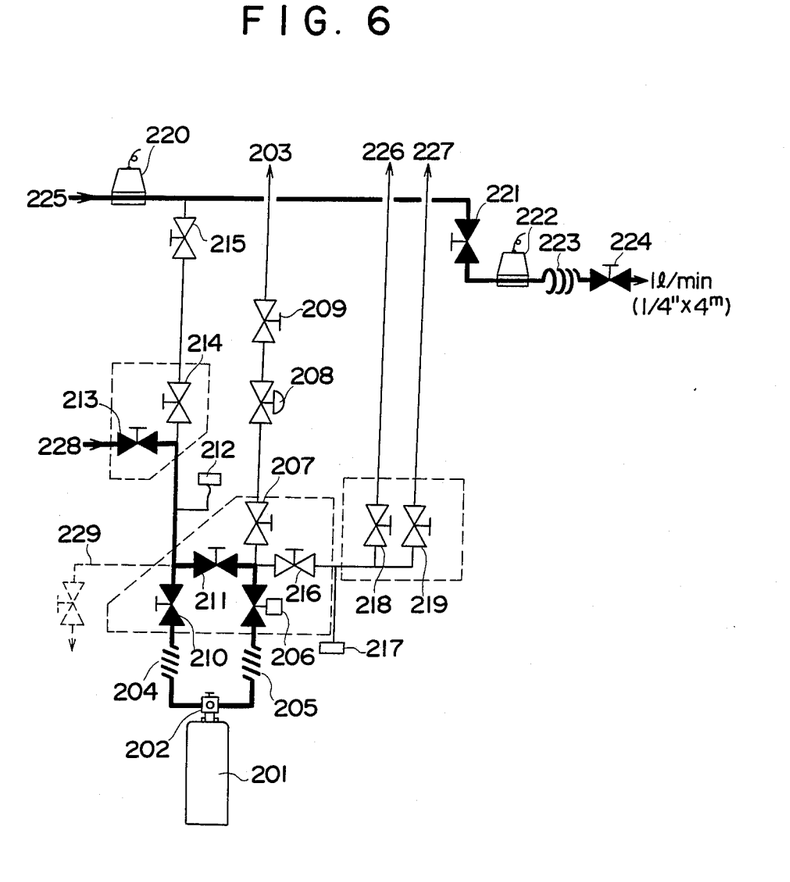
Figure 7:
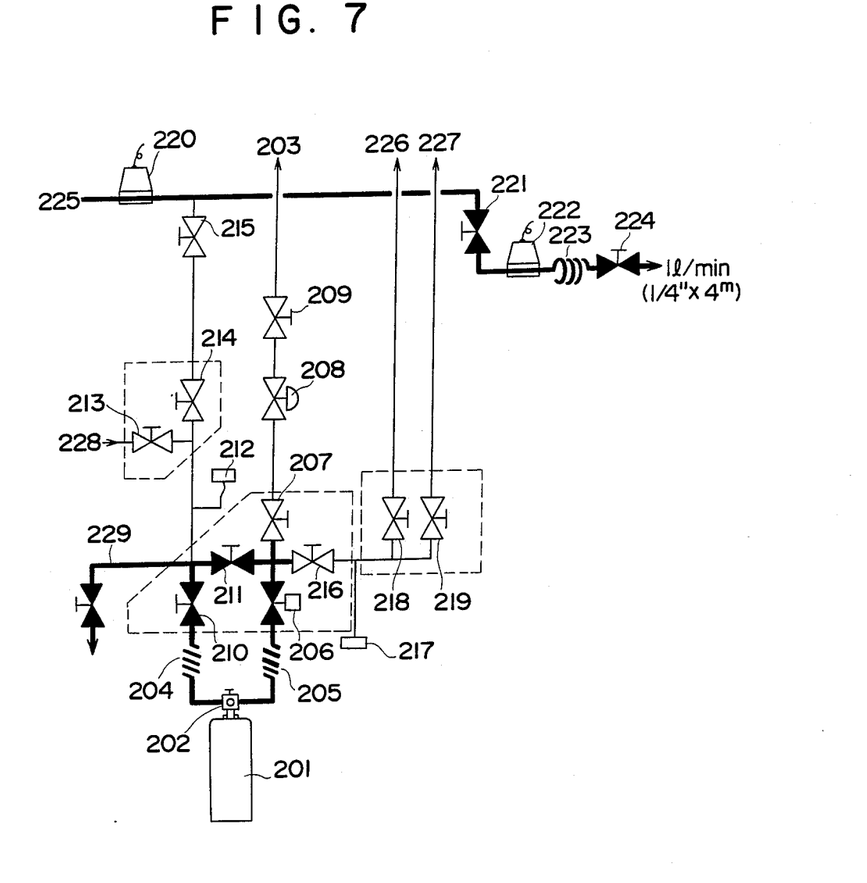
Figure 8:
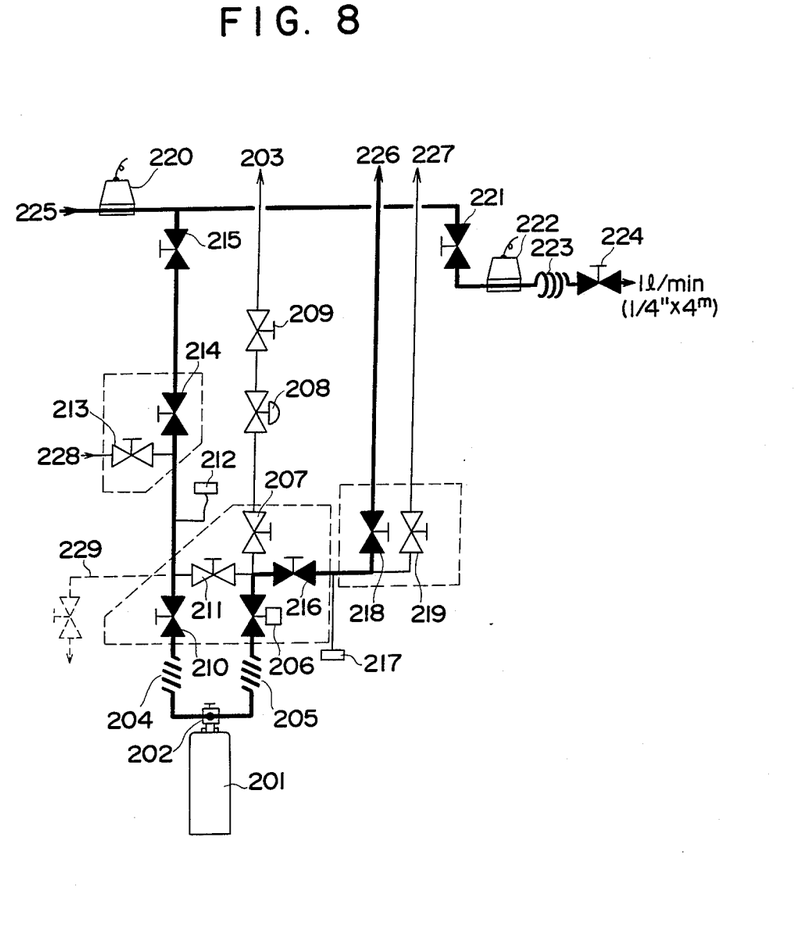

FIG. 5 represents the procedures to be taken when the cylinder is replaced. 201 is removed out of the cylinder cabinet piping system, while the valves 207 and 216 are closed and the valves 215, 214, 210 and 211 are open. Little air will flow into the system while the cylinder is removed, since the purge gas supplied from the purge gas line 225 is blown into the atmosphere through the spiral pipes 204 and 205. The purge gas velocity is adjusted at 1 m/s or more, preferably 3 m/s or more, by controlling the flow of the purge gas using the mass flow meter 220 and the mass flow controller 222. The higher the velocity at which the purge gas blows out, the less the extent of the system contamination. A new cylinder is mounted on the system while the purge gas is blown. On completion of mounting the cylinder, the leak test is conducted at an elevated pressure for the connections around the cylinder, following the procedures shown in FIG. 6. The system is filled with the gas from the high-pressure line to a given pressure level by slowly opening the valve 213, while the valves 207, 216, 214 and 215 are closed and the valves 210, 211 and 206 being open. Confirmation that there is no pressure drop for a given time period is accomplished by watching the pressure gauge 212. Check the connections around the cylinder when a pressure drop is detected, since it indicates failure of the connections. The desired gases, for the leak test at an elevated pressure are $H_2$, $N_2$ and Ar; $H_2$ being particularly desired to check a very small quantity of leak. It is not recommended to use He, when the test is followed by the leak test with He (Tadahiro Ohmi, Yoshio Ihihara and Mizuho Morita, "Challenges to PPT, Use of a He Detector to Reduce Contaminant Levels to ppt Order", Nikkel Microdevices, pp. 124–132, September, 1987). After confirming that there is no leak by the test at an elevated pressure, the leak test is conducted at a reduced pressure with the aid of a He detector following the procedures shown in FIG. 7. Connecting the He detector to a He leak port, the pressure in the piping system is confirmed by watching the pressure gauge 212, and the gas in the system can be driven off as required into air through the exhaust line 226 or the vacuum exhaust line 227. Checking leaks in the connections around the cylinder is accomplished by using the He detector, while the valves 207, 216 and 214 are closed and the valves 210, 211 and 206 are open. Check the connections around the cylinder if a leak is detected by the He leak test, as is the case with the test at an elevated pressure. It is recommended to use the leak tests both at an elevated pressure and a reduced pressure, since the stresses to which the system is subjected are opposite in direction to each other in these tests. On completing the leak tests, the piping and a cylinder valve systems are cleaned to remove the contaminants, by purging with a continuously blown gas followed by batch purging consisting of cycles of pressurization / releasing / evacuation. FIG. 8 shows the continuous purging procedures. The purge gas is blown continuously at a given rate, e.g., 10 to 20 l/m, from the purge gas line 225 to the exhaust line 226 via the cylinder valve 202, while the valves 207, 211, 219 are closed and the valves 215, 214, 210, 206, the purge valve of the cylinder valve 202, valves 216 and 218 are open. It is needless to say that the higher the purge gas rate, the faster the contaminants flowing into the system while the cylinder is removed are purged. A high-purity $N_2$ gas is normally used for this initial purging step. The contaminants which can not be removed during the continuous purging step are then driven of by the batch purging step, where the cycle of pressurization (FIG. 9), releasing (FIG. 10) and evacuation (FIG. 11) is repeated as needed. It is desired to use Ar for the batch purging step, because it is easily purified and inert.

Figure 9:
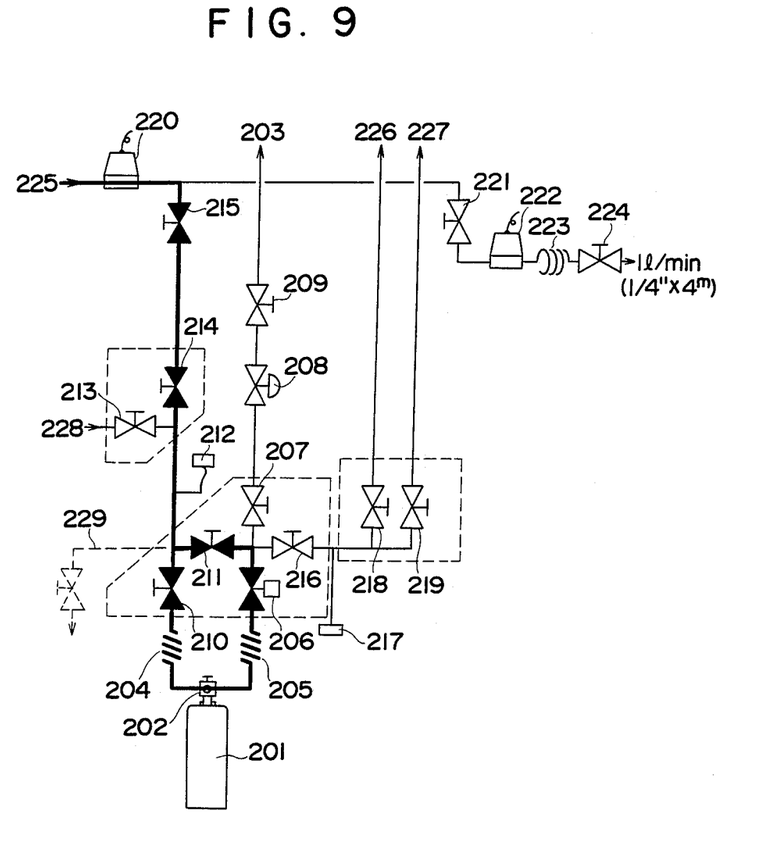
Figure 10:
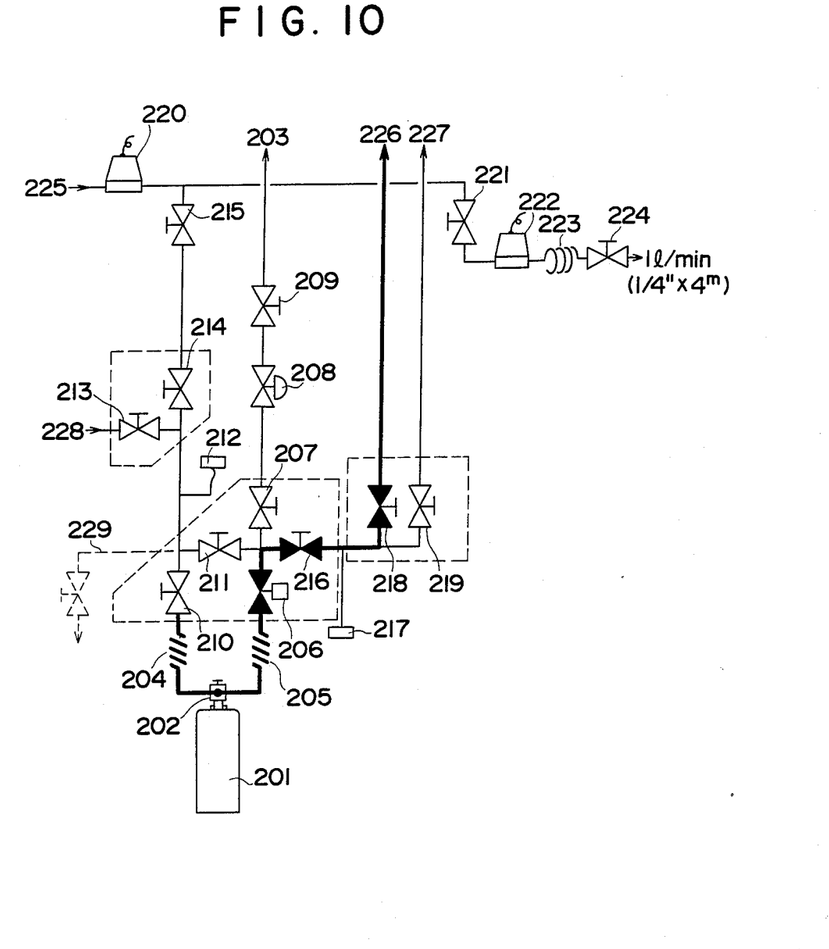
Figure 11:
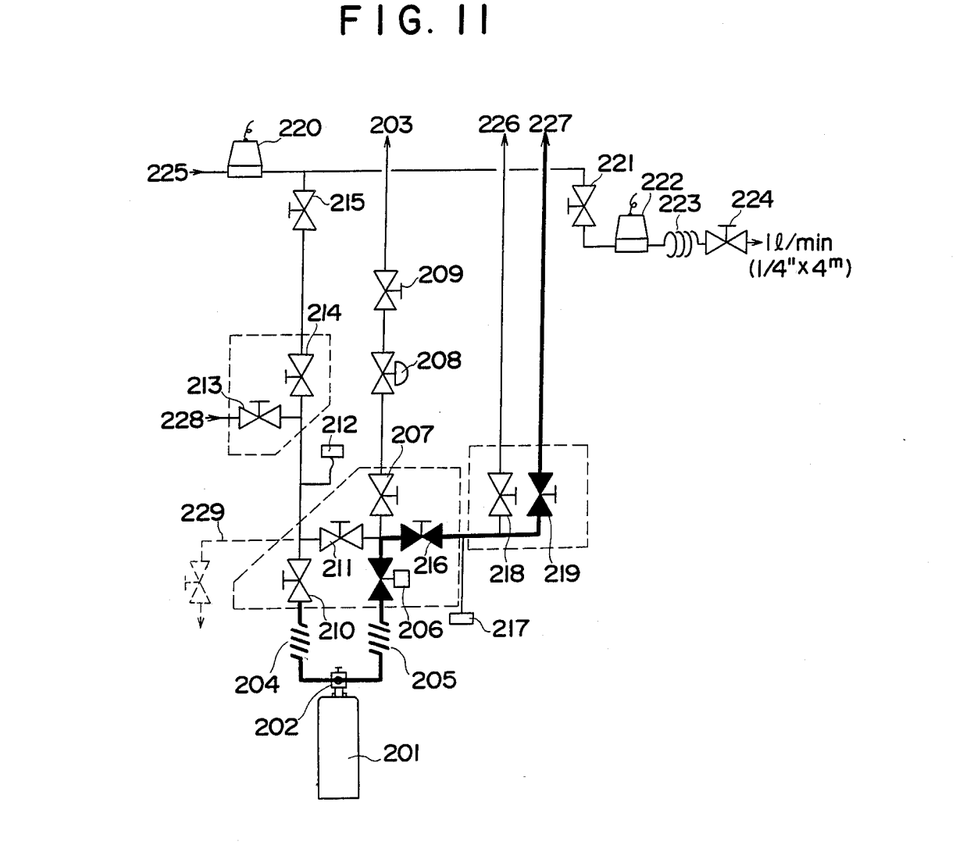
Figure 12:
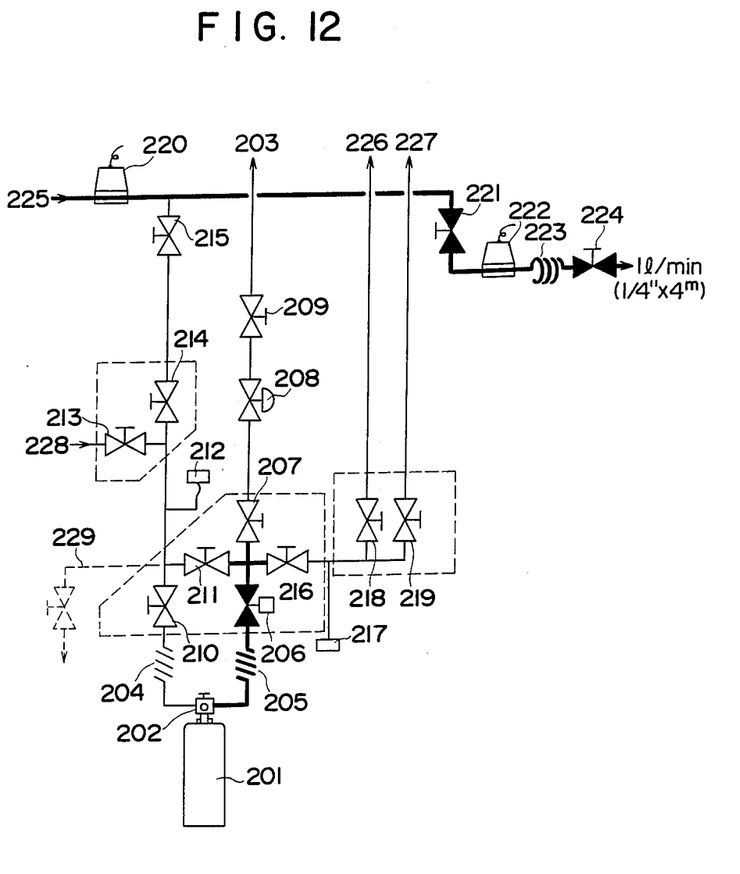
Figure 13:
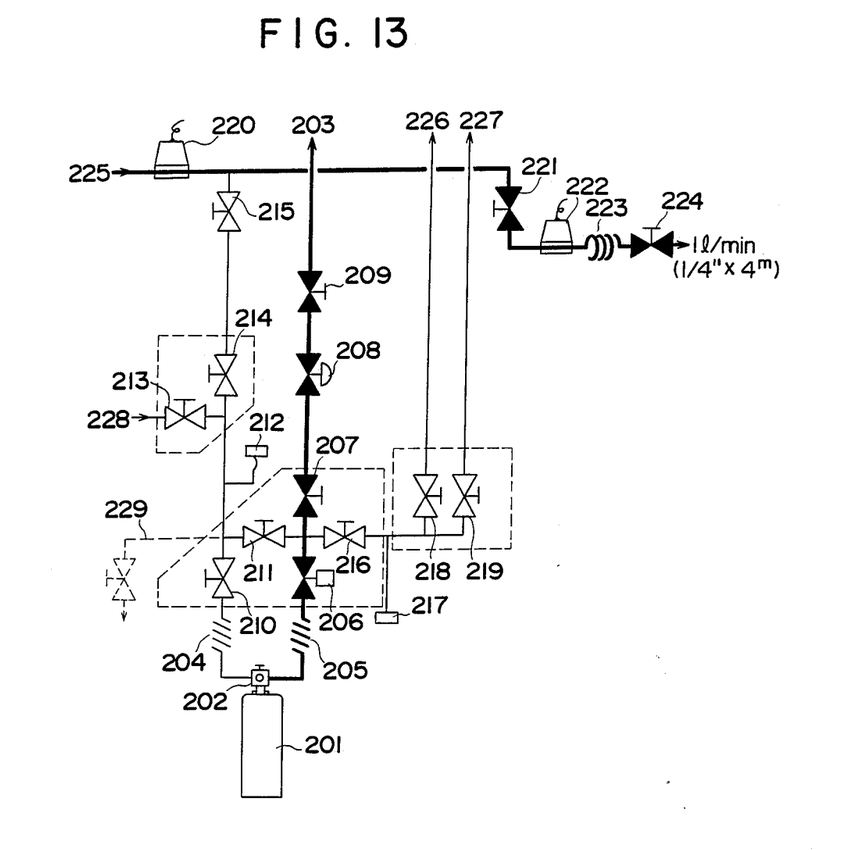

The system is pressurized to a given level with the purge gas coming from the purge gas line 225, while the valves 207 and 216 are closed and the valves 215, 214, 210, 211, 206 and the purge valve of the cylinder valve 202 are open, as shown in FIG. 9. The purge gas in the piping system is then released into the exhaust line 226, while the valves 207, 210, 211 and 219 are closed and the valves 206, 216 and 218 are open, as shown in FIG. 10. Care must be taken to keep the system at a positive pressure around 1 kg/cm$^2$ G, in order to prevent inflow of air into the piping system through the exhaust line. Then, the system is evacuated, while the valve 218 are closed and the valve 219 are open as shown in FIG. 11, to drive off the remaining gas through the vacuum exhaust line 227. The pressurization/releasing /evacuation cycle is repeated normally 5 to 20 times to clean the piping system by purging off the contaminants such as air remaining therein. The more times the batch purging cycles are repeated, the fewer contaminants remain in the system. A small quantity of the purge gas, remaining in the system after the contaminants are removed by the continuous and subsequent batch purging steps, is replaced batchwise by the cylinder gas. The replacement procedures are shown in FIG. 12 for pressurization and in FIG. 13 for releasing. For the pressurization of the piping system with the cylinder gas (FIG. 12), close the purge valve of the cylinder valve 202 while the valves 210, 211, 213, 216, 218, 219 and 207 are closed, then slowly open the main valve of the cylinder valve to fill the piping system with the cylinder gas, and finally close the main valve of the cylinder valve. For releasing the cylinder gas (FIG. 13), open the valve 207 and 209 in this order, while watching the primary and secondary pressure readings of the pressure regulator 208, to release the gas into the gas supply line 203 which is to feed the cylinder gas to the process unit. The branch line is provided in the gas supply line immediately before the process unit, using a proper type of valve such as a 3-way valve incorporating two valves, one being directed to the process unit and the other to the exhaust line, through which the releasing is effected. The pressurization / releasing with the cylinder gas is repeated 5 to 20 times to completely replace the gas in the gas supply line 203 by the cylinder gas.

The cabinet piping system cleaned by the above procedures can now supply the clean cylinder gas to the process unit. Gas is passed through the purge gas line at the highest possible rate while the system is cleaned. Close the valves 224 and 221 in this order, if the gas flow through the purge gas line must be stopped, close the valves 224 and 221 in this order.

The cylinder cabinet piping system of the present invention is illustrated by referring to FIG. 1 which shows one preferred embodiment of the present invention. It is obvious that a cylinder cabinet piping system to supply a special feed gas to a process unit may differ from one another in the structure and operational procedures depending on how the cylinder gas is handled and used, but the basic concept of the present invention is applicable to all types of cylinder cabinet piping systems.

The present invention provides the cylinder cabinet piping system in which there is no gas stagnant section in the purge gas line, and inflow of a gas into one line from the atmosphere or mix of a gas in one line into another line is minimized and the connections around the cylinder can be tested under a reduced pressure for leak, and thereby enables production of high-quality thin films and high-quality etching.

Moreover, the cylinder cabinet piping system of the present invention can supply $SiH_4$ or $Si_2H_6$ whose moisture content is 10 ppb or below at the process unit, when the newly developed clean gas cylinder for semiconductor production is used therein, the gas cylinder being of out-gas-free stainless steel and oxidation-treated with a super-high-purity oxygen for inner walls, as mentioned earlier.

Use of the clean feed gas containing lesser quantities of impurities enables to decrease temperature for Si epitaxial growth to as low as 600° C. Another advantage derived from use of the present invention is improved selectivity of silicon deposition of Si and $SiO_2$; deposition of Si on Si is selectively promoted, while its deposition of $SiO_2$ is minimized. It is to be noted that such selectivity is realized with a gas, such as $SiH_4$ and $Si_2H_6$, which has no etching functions.

What is claimed is:

1. A cylinder cabinet piping system comprising:
  a process gas cylinder connected to at least one cylinder valve, a process system and at least one process gas supply line for supplying process gas from said at least one cylinder valve to said process system,
  a purge gas line and a main line, said main line for continuously passing purge gas supplied from said purge gas line both during the time process gas is supplied to said process system and during the time that purge gas is passed through said cylinder cabinet piping system for purging said system; and
  at least one branch line connecting said main line to said at least one process gas supply line, a valve connected in said at least one branch line, whereby purging gas is continuously supplied through said main line to prevent stagnation and contamination of purge gas in the purge gas line.

2. A cylinder cabinet piping system as set forth in claim 1, including a vacuum exhaust line connected to a vacuum exhaust system, for connecting said at least one process gas supply line to said vacuum exhaust system and at least one valve connected in said vacuum exhaust line.

3. A cylinder cabinet piping system as set forth in claim 2, including a high pressure gas line connected to said at least one branch line for performing an external leak test for the connection of said at least one cylinder valve with the cylinder.

4. A cylinder cabinet piping system as set forth in claim 2, wherein a reduced pressure He leak test line is connected to said at least one branch line for performing an external leak test for the connection of said at least one cylinder valve with the cylinder.

5. A cylinder cabinet piping system as set forth in claim 2 wherein said at least one cylinder valve includes a main valve and a purge valve, said system further comprising:
   a purge line connected to said at least one branch line and to said purge valve; and
   said at least one process gas supply line connected to said main valve, and the exhaust line connected to said at least one process gas supply line by means of said at least one valve.

6. A cylinder cabinet piping system as set forth in claim 5, wherein a high pressure gas line is connected to said at least one branch line for performing an external leak test for the connection of said at least one cylinder valve with the cylinder.

7. A cylinder cabinet piping system as set forth in claim 5, wherein a reduced pressure He leak test line is connected to said at least one branch line for performing an external leak test for the connection of said at least one cylinder valve with the cylinder.

8. A cylinder cabinet piping system as set forth in claim 1 wherein said at least one cylinder valve includes a main valve and a purge valve, said system further comprising:
   a purge line connected to said at least one branch line and connected to said purge valve; and
   said at least one process gas supply line connected to said main valve, and an exhaust line connected to said at least one process gas supply line by said at least one valve.

9. A cylinder cabinet piping system as set forth in claim 8, wherein a high pressure gas line is connected to said at least one branch line for performing an external leak test for the connection of said at least one cylinder valve with the cylinder.

10. A cylinder cabinet piping system as set forth in claim 8, wherein a reduced pressure He leak test line is connected to said at least one branch line for performing an external leak test for the connection of said at least one cylinder valve with the cylinder.

11. A cylinder cabinet piping system as set forth in claim 1, wherein a high pressure gas line is connected to said at least one branch line for performing an external leak test for the connection of said at least one cylinder valve with the cylinder.

12. A cylinder cabinet piping system as set forth in claim 1, wherein a reduced pressure He leak test line is connected to said at least one branch line for performing an external leak test for the connection of said at least one cylinder valve with the cylinder.

* * * * *